United States Patent [19]

Makino et al.

[11] 4,004,085

[45] Jan. 18, 1977

[54] RECEIVING PROGRAM-PRESETTING SYSTEM FOR A TELEVISION RECEIVER

[75] Inventors: Shinichi Makino, Fujisawa; Naoyuki Kokado, Tokyo, both of Japan

[73] Assignee: Tokyo Shibaura Electric Co., Ltd., Kawasaki, Japan

[22] Filed: Apr. 14, 1975

[21] Appl. No.: 567,870

[30] Foreign Application Priority Data

Apr. 19, 1974 Japan .............................. 49-43466

[52] U.S. Cl. .................... 340/324 AD; 178/DIG. 6; 178/DIG. 15; 325/396

[51] Int. Cl.² .......................................... H04N 7/18

[58] Field of Search ......... 178/6.8, DIG. 6, DIG. 9, 178/DIG. 15; 325/396; 340/324 A, 324 AD

[56] References Cited

UNITED STATES PATENTS

| | | | |
|---|---|---|---|
| 3,017,625 | 1/1962 | Evans | 340/324 A |
| 3,465,097 | 9/1969 | Brabon | 178/DIG. 6 |
| 3,800,230 | 3/1974 | Marks | 325/396 |
| 3,898,377 | 8/1975 | Fairbairn | 178/DIG. 6 |
| 3,898,644 | 8/1975 | Baxter | 178/DIG. 6 |

*Primary Examiner*—Howard W. Britton
*Attorney, Agent, or Firm*—Finnegan, Henderson, Farabow & Garrett

[57] ABSTRACT

A television receiving program-presetting system comprises means for storing receiving program information in a specified address of a memory; a circuit for defining a vertical address position on a Braun tube screen by counting horizontal synchronizing pulses; a circuit for designating a horizontal address position on the Braun tube screen by counting clock pulses having a higher frequency than the horizontal synchronizing pulses; means for successively producing address information designating the addresses of the memory upon receipt of the outputs from at least the vertical address position defining circuit; means for supplying the address information to the memory and successively reading out the stored program information therefrom; a circuit for generating signals denoting character patterns corresponding to the program information thus read out; means for displaying the character patterns in the form of program information at that address position on the Braun tube screen which is designated by an output signal from the circuit for defining at least a vertical address position on the Braun tube screen; and means for temporarily shutting off the supply of an image signal to the Braun tube while the program information is displayed thereon.

5 Claims, 10 Drawing Figures

RECEIVING PROGRAM-PRESETTING SYSTEM FOR A TELEVISION RECEIVER

This invention relates to a receiving program-presetting system for a television receiver and more particularly to the type capable of automatically receiving a selected television program according to the preset receiving program, or stopping any image reception at a prescribed point of time. Receiving program-presetting systems known to date include a type provided with a mechanical switch coupled with a clock device or a mechanical type based on application of an electric motor. Obviously, however, these prior art program-presetting systems involving such mechanical elements are accompanied with the drawbacks, for example, that they fail to preset a large number of receiving programs, become bulky and have a short effective life. On the other hand, various forms of electronic television receiving program-presetting system already proposed are all handicapped by complicated operation. Particularly, an electronic program-presetting system using a keyboard as a program input device requires too intricate a process of supplying a given item of program information to said system for a general household user to accept it. Any prior art electronic television receiving program-presetting system has further disadvantages that it is difficult easily to recognize the content of the preset program or change the content after the program is preset.

It is accordingly the object of this invention to provide a receiving program-presetting system for a television receiver which is saved from the above-mentioned defects of the prior art program-presetting systems by giving full play to the orginal arrangement and function of said television receiver.

According to an aspect of this invention, there is provided a television receiving program-presetting system which comprises means for supplying a piece of program information being preset; means for storing the input program information in a designated address of a memory; a circuit for counting the number of horizontal synchronizing pulses given forth in a television receiver, thereby designating a vertical address position on the Braun tube screen of the receiver; a circuit for counting the number of clock pulses having a higher frequency than the horizontal synchronizing pulses synchronously with the latter pulses, thereby specifying a horizontal address position on the Braun tube screen; means for successively generating signals designating the required addresses of the memory when supplied with output signals from at least the vertical address position-designating circuit included in the vertical and horizontal address position-designating circuits; means for supplying the address-designating signals to the memory, thereby reading out various forms of program information stored in the memory; a circuit for producing signals denoting character patterns corresponding to the various forms of program information thus read out; means for delivering said character pattern signals to the Braun tube, thereby displaying various forms of program information at the address positions on the Braun tube screen designated by output signals from at least the vertical address position-designating circuit; and means for temporarily shutting off the supply of an image signal to the Braun tube while the preset program information is displayed on the Braun tube screen.

With a television receiving program-presetting system according to this invention, program information being preset, that is, a set of items of information, for example, on the specified number of a television broadcasting channel from which an image is to be received, and time data, namely, a point of time at which image reception is to be commenced is supplied from the program information input means. The above-mentioned items of program information are stored in the corresponding designated addresses of a memory. On the other hand, a circuit for defining an address position on the Braun tube screen generates signals designating the selected addresses of the memory. The items of program information stored in the specified addresses of the memory are successively read out upon receipt of an address-designating signal. The items of program information thus read out are displayed on the address positions on the Braun tube screen which are designated by output signals from the circuits for determining vertical and horizontal address positions on the Braun tube screen. The larger the number of addresses provided in the memory, the more numerous the television programs being preset. In such case, the address positions at which program information is to be displayed should be defined on both right and left sides of the Braun tube screen. Therefore, it is necessary to generate address-designating signals by output signals from the circuits for defining vertical and horizontal address positions on the Braun tube screen. The television program-presetting system of this invention provided with a proper changeover switch makes it possible not only to observe the content of a preset television program freely as desired on the television receiver screen, but also to add a fresh television program being preset or change the already preset program while looking at the content of a television program now on display.

This invention can be more fully understood from the following detailed description when taken in conjunction with the accompanying drawings, in which.

Figure 4:
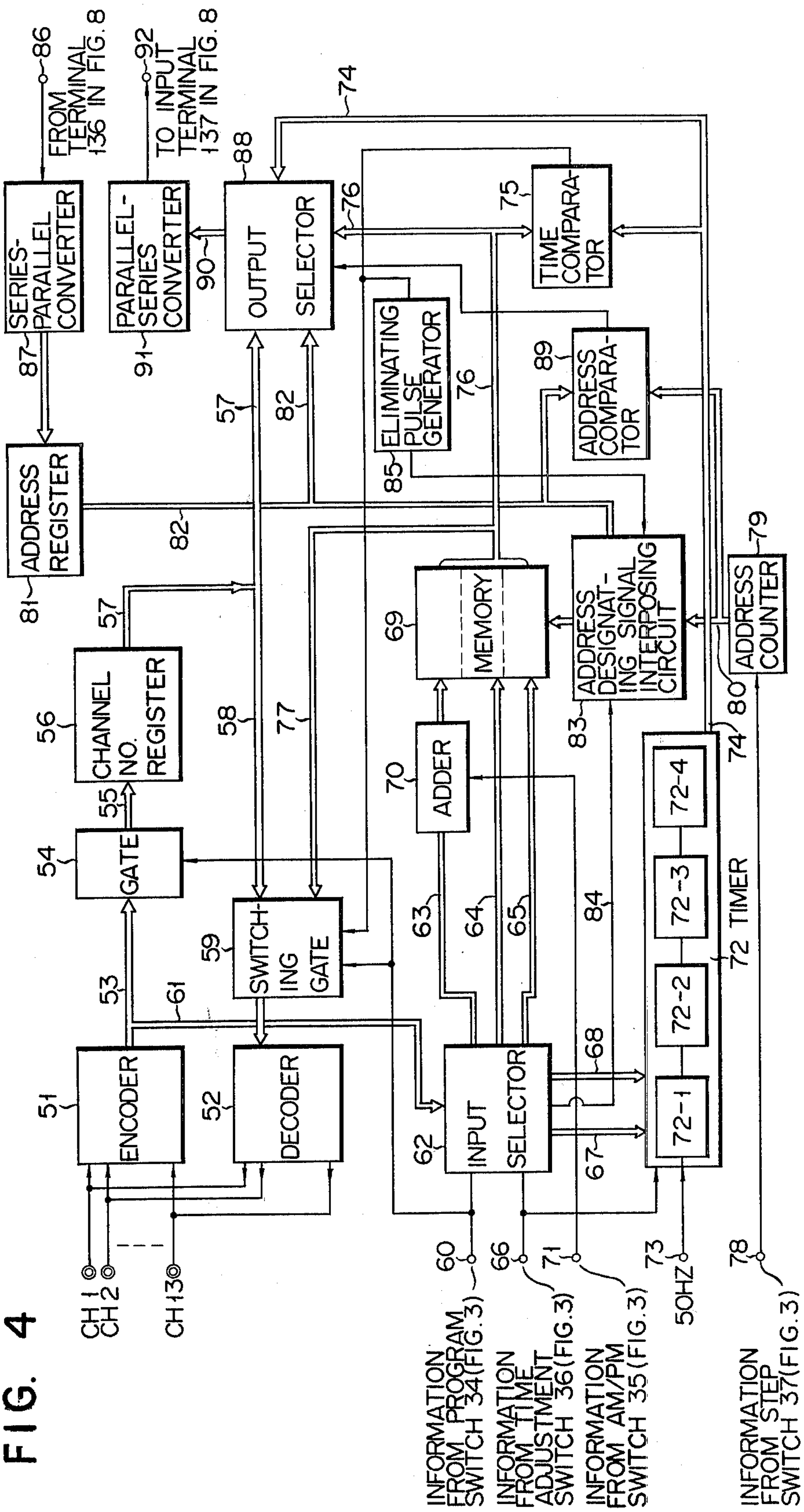
FIG. 4 is a circuit diagram of the memory and its control device used in this invention.
Figure 5:
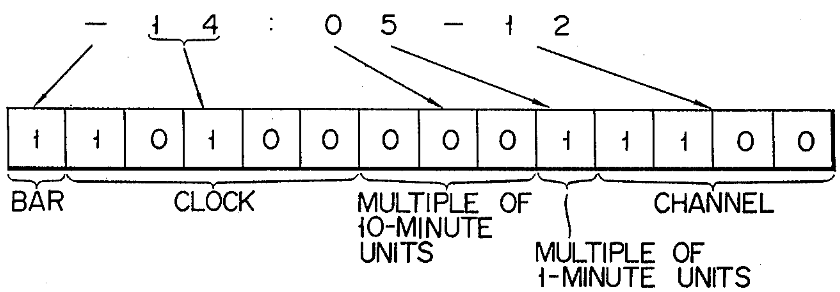
Figure 9:
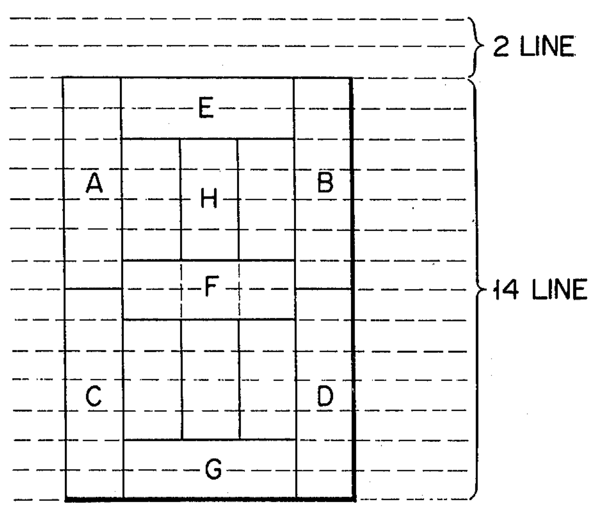
Figure 6:
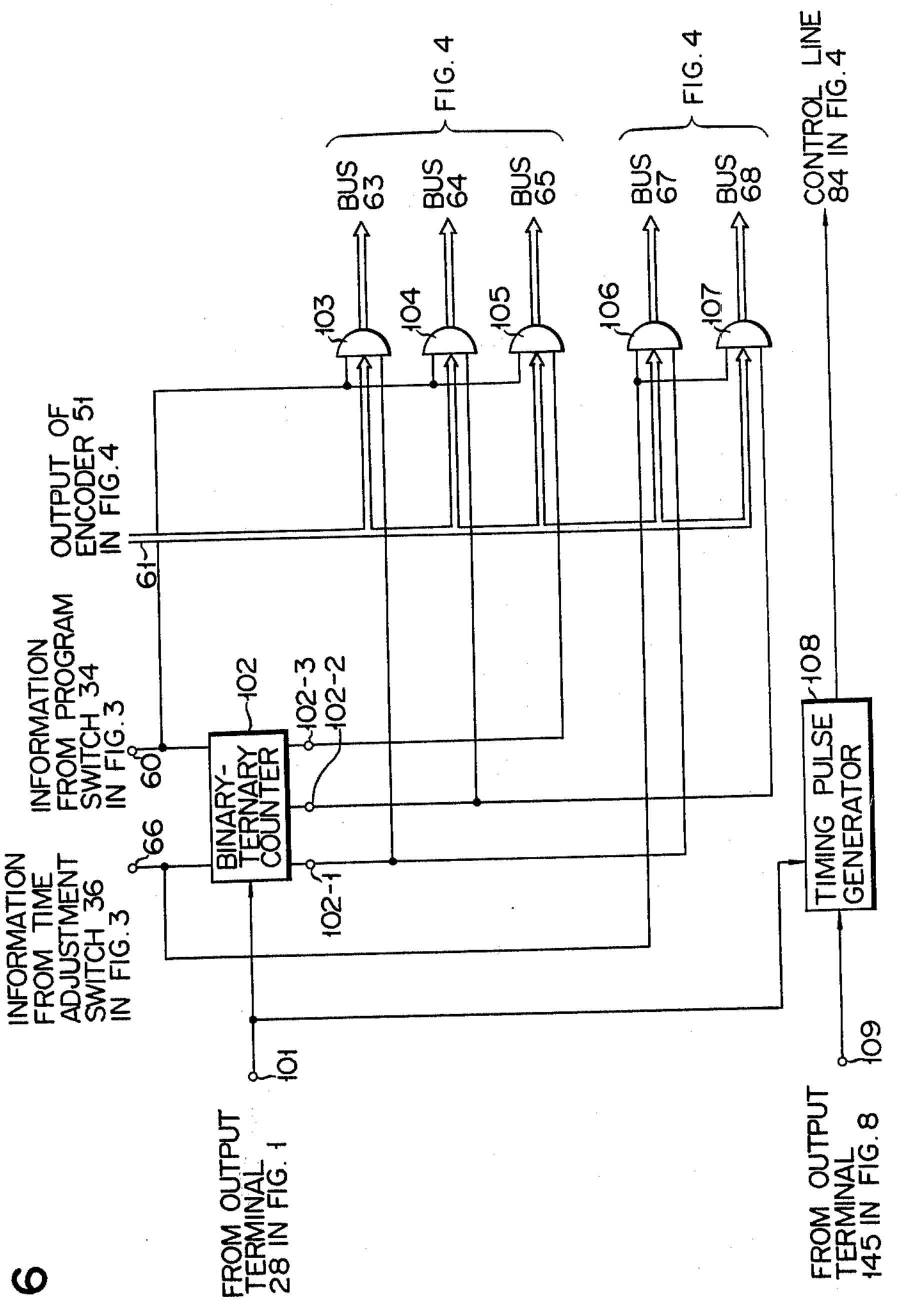
Figure 7:
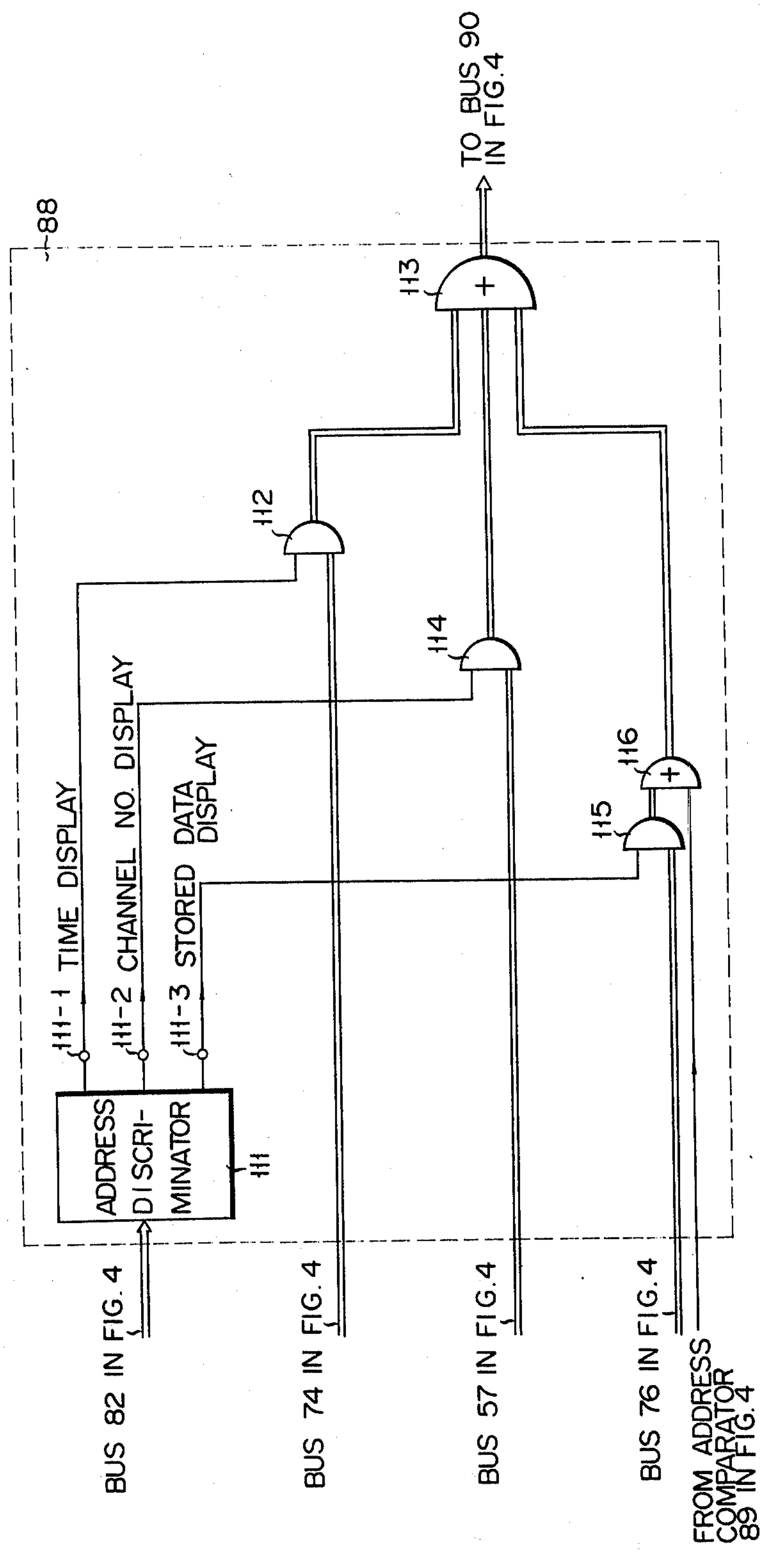
Figure 8:
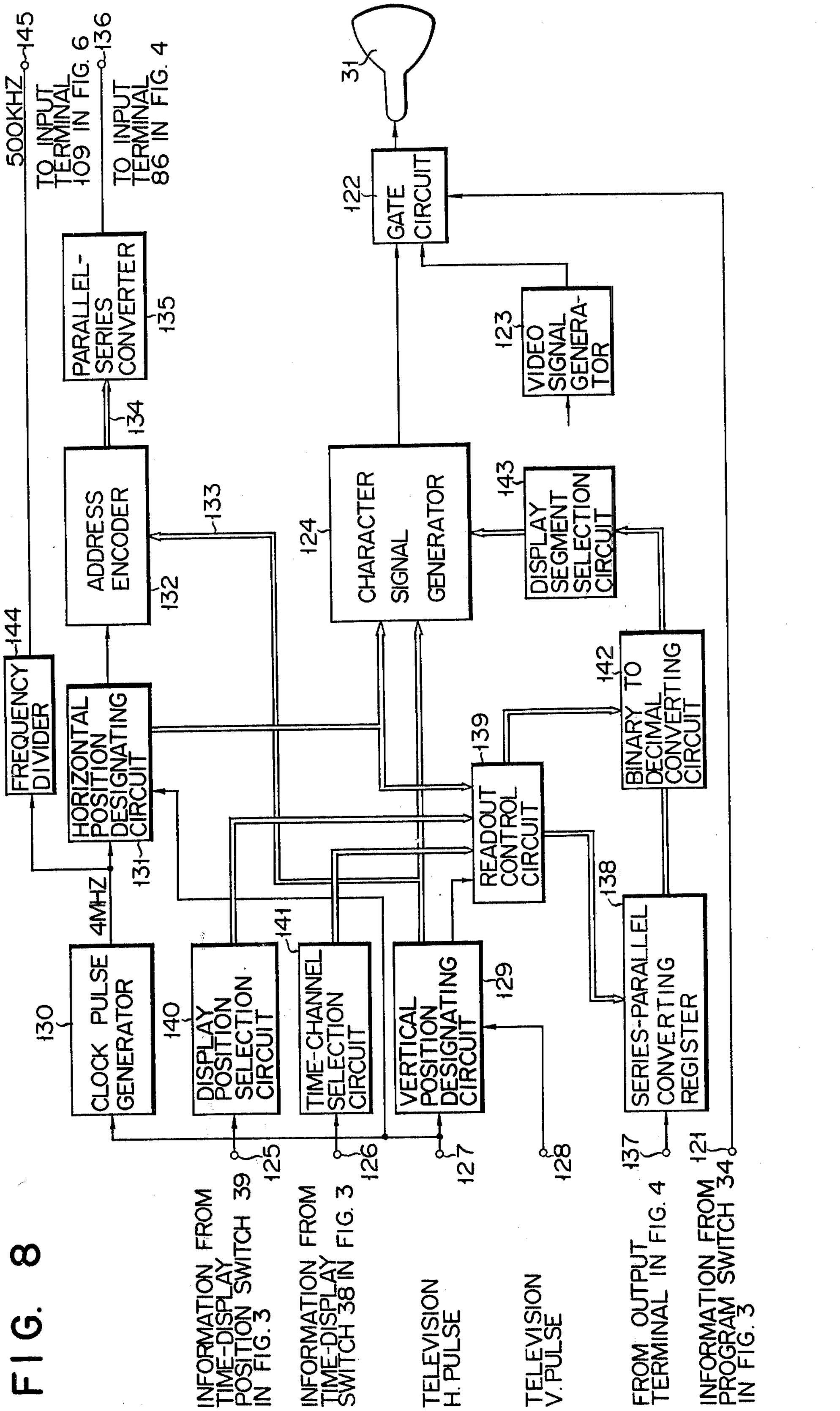
Figure 10:
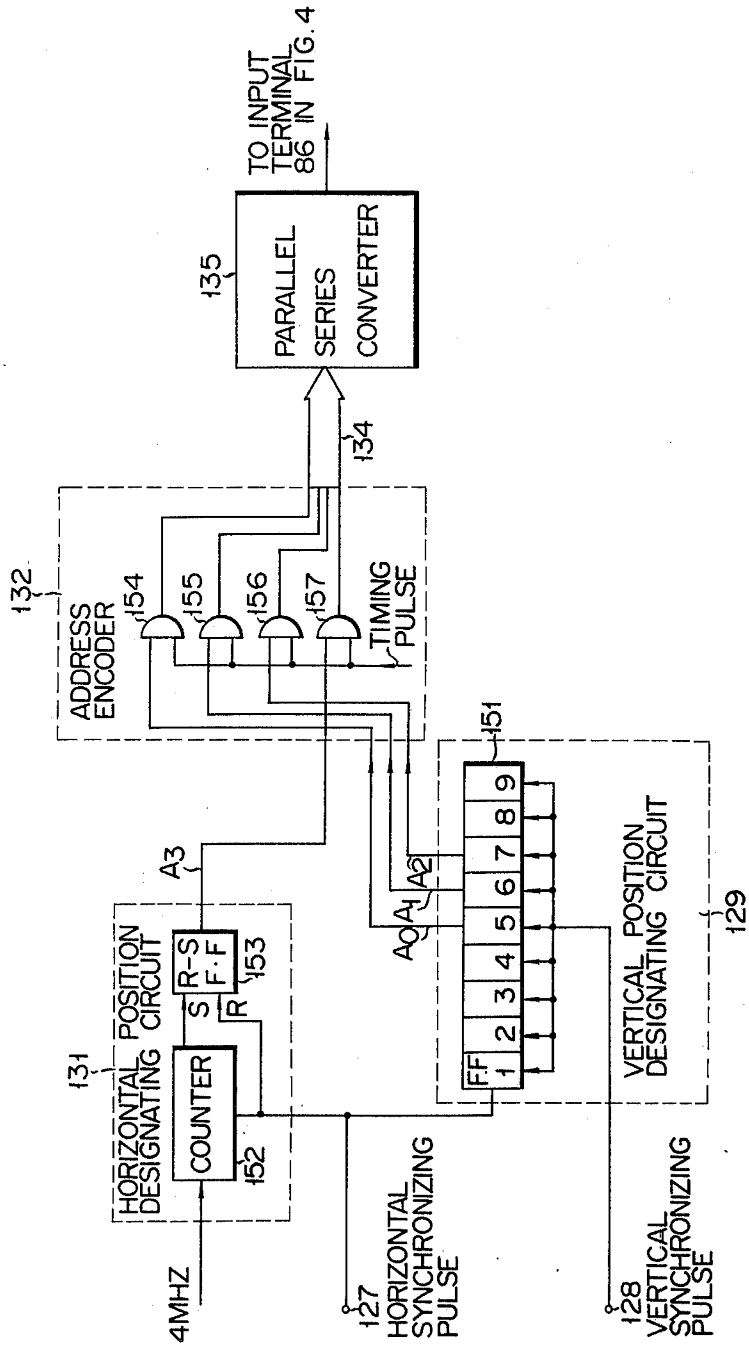

FIG. 5 sets forth a pattern of a given item of television receiving program information stored in the coded form in the designated address of the memory included in FIG. 4;

FIG. 6 is a block circuit diagram of an input selector included in FIG. 4;

FIG. 7 is a block circuit diagram of an output selector included in FIG. 4;

FIG. 8 is a block circuit diagram of the preset television receiving program display device of the program-presetting system of this invention;

FIG. 9 shows the relationship between the segments of one character pattern displayed on the Braun tube screen included in FIG. 8 and the corresponding raster; and FIG. 10 is a detailed circuit diagram of an address-designating signal generator included in FIG. 8.

Figure 1:
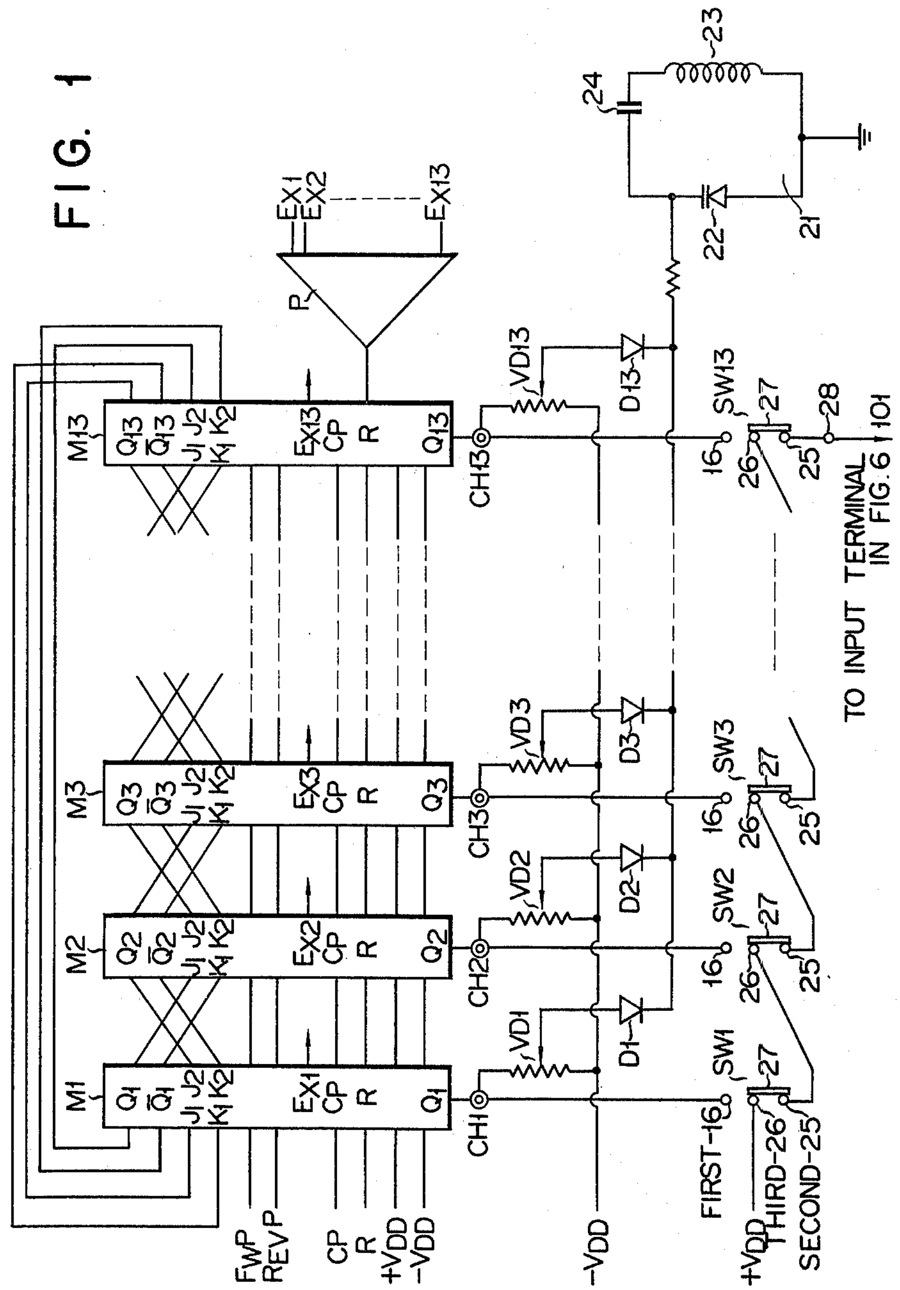
FIG. 1 is a block circuit diagram of an embodiment of a television channel-selecting device used with a television receiving program-presetting system according to this invention.
Figure 2:
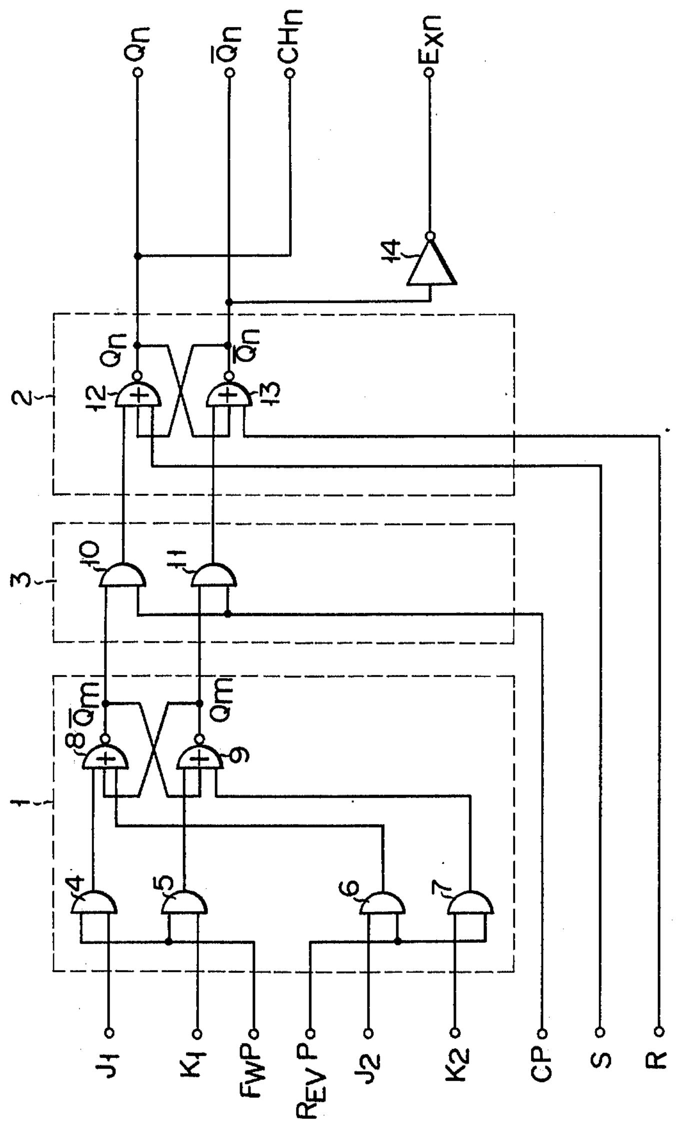
FIG. 2 is a detailed representation of a memory circuit included in FIG. 1.

Memory circuits denoted by referential numerals M1 to M13 in FIG. 1 are illustrated in FIG. 2. These memory circuits are each known as master-slave type flip-flop circuits. Each of said flip-flop circuits consists of a master flip-flop circuit 1 (hereinafter referred to as "a master circuit"), a slave flop-flop circuit 2 (hereinafter referred to as "a slave cicuit") and a switch circuit 3 for connecting both flip-flop circuits 1, 2 together. The master circuit 1 is a JK flip-flop circuit supplied with $J_1$, $K_1$ signals ($J_1$ and $K_1$) representing input signals or terminals. These $J_1$, $K_1$ signals are controlled by a signal from the terminal FwP (or denoting an input signal) in AND circuits 4, 5. The master circuit 1 is further provided with J, K input terminals $J_2$, $K_2$ (or denoting input signals). The input signals $J_2$, $K_2$ are controlled by a signal from a terminal RevP (or denoting an input signal) in AND circuits 6, 7, and thereafter delivered to NOR circuits 8, 9 (FIG. 2) each of 3-input terminal type jointly constituting a flip-flop circuit (hereinafter referred to as an "FF circuit"). The switch circuit 3 is formed of AND circuits 10, 11 controlled by a signal from a CP terminal. Output signals $Qm$, $\bar{Q}m$ from the master circuit 1 are selectively supplied to NOR circuits 12, 13 each of 3-input terminal type constituting the slave circuit 2. One NOR circuit 12 is supplied with a signal from a set terminal S and the other NOR circuit 13 is supplied with a signal from a reset terminal R, thereby setting or resetting the slave circuit 2 as required. Both output signals, $Qn$, $\bar{Q}n$ (or denoting terminals) from the slave circuit 2 are conducted to the corresponding terminals $Qn$, $\bar{Q}n$. One output signal $Qn$ is sent to a terminal CH$n$ ($n$ denoting the specified number of a television channel being preset) as a channel-selecting signal. The other output signal $\bar{Q}n$ is carried to a terminal Ex$n$ through an inverter 14.

Now let it be assumed that the terminal FwP is supplied with a binary signal of "1". Then items of information supplied to the terminals $J_1$, $K_1$ are stored in the master circuit 1. Where, under this condition, the terminal CP is supplied with a "1" signal, then the data stored in the master circuit 1, namely, output signals $Qm$, $\bar{Q}m$ therefrom are shifted to the slave circuit 2. This slave circuit 2 produces output signals corresponding to the information items stored therein at the terminals $Qn$, $\bar{Q}n$, CH$n$, Ex$n$. The information stored in the slave circuit 2 is reset, for example, to a level of "0" upon receipt of a signal at the reset terminal R. Upon receipt of a signal at the set terminal, the slave circuit 2 is stored with information of "1".

FIG. 1 shows thirteen units of the above-mentioned memory circuit corresponding to the number of television channels which are denoted by referential numerals M1 to M13. In FIG. 1, referential numerals $Q_1$ to $Q_{13}$ and $\bar{Q}_1$ to $\bar{Q}_{13}$ denote output signals from the slave circuit 2 of FIG. 2 or the output terminals thereof. The memory circuits M1 to M13 are connected as follows. For example, the output terminals $Q_2$, $\bar{Q}_2$ of the second memory circuit M2 are connected to the input terminals $J_1$, $K_1$ of the third memory circuit M3 and also to the input terminals $J_2$, $K_2$ of the first memory circuit M1. This form of circuit connection applies to the other memory circuits than the first and thirteenth memory circuits M1, M13. The input terminals $J_1$, $K_1$ and output terminals $Q_1$, $\bar{Q}_1$ of the first memory circuit M1 are connected to the output terminals $Q_{13}$, $\bar{Q}_{13}$ and input terminals $J_2$, $K_2$ of the thirteenth memory circuit M13. The terminals FwP, RevP, CP, R are connected together throughout the memory circuits M1 to M13. Output signals from these terminals are supplied in parallel to the memory circuits M1 to M13. The Exn terminals (or denoting output signals) of the memory circuits M1 to M13 are connected to the input side of a parity signal generator P. This parity signal generator P is formed of, for example, an exclusive OR circuit and inverter circuit combined together, and generates an output signal when the input terminals $Ex_1$ to $Ex_{13}$ are supplied with an even number of binary signals "1". This output signal is conducted to the reset terminals R of the memory circuits M1 to M13.

The output terminals $CH_1$ to $CH_{13}$ of the memory circuits M1 to M13 are connected to one terminal each of the stationary resistors of voltage dividers $VD_1$ to $VD_{13}$ provided to match the memory circuits M1 to M13. The other terminal of said stationary resistors is connected to a negative power source −VDD. Signals denoting fractions of a uniform voltage drop resulting from the stationary resistors are drawn out in different prescribed voltage division ratios by means of the corresponding sliders. These signals are joined together through diodes $D_1$ to $D_{13}$, and further conducted in the form of D.C. back bias voltage to a variable capacity diode 22 constituting the tuning circuit 21 of a television tuner through a resistor. Said tuning circuit 21 includes, for example, a coil 23 and D.C. suppression condenser 24. Though only one unit of said tuning circuit 21 is shown in FIG. 1, a plurality thereof are practically used with an ordinary television tuner for high frequency amplification and local oscillation. The output terminals $CH_1$ to $CH_{13}$ of the memory circuits M1 to M13 are connected to the first stationary contact 16 of channel-selecting pushbutton switches $SW_1$ to $SW_{13}$. Each channel-selecting pushbutton switch SW has a second stationary contact 25, a third stationary contact 26 and a movable contact 27 for selectively connecting the third contact 26 to the first stationary contact 16. The second stationary contact 25 is connected to the third contact 26 of the adjacent channel-selecting pushbutton switch. The third stationary contact 26 of the extreme left channel-selecting pushbutton switch $SW_1$ is connected to a positive power source +VDD. The second stationary contact 25 of the extreme right channel-selecting pushbutton switch $SW_{13}$ is connected to an input terminal 101 (FIG. 6) through a terminal 28. The memory circuits M1 to M13 are connected to the positive and negative power sources +VDD, −VDD respectively.

There will now be described the operation of the channel-selecting device of FIG. 1. Where, in FIG. 2, the terminal FwP is supplied with a pulse of "1", then items of information supplied to the terminals $J_1$, $K_1$ are stored in the master circuit 1. Where, under this condition, the terminal CP is supplied with a clock pulse, then the information items $Qm$, $\bar{Q}m$ stored in the master circuit 1 are shifted to the slave circuit 2. The information items stored in the slave circuit 2 deliver the corresponding output signals to the terminals $Qn$, $\bar{Q}n$, CH$n$, Ex$n$. Said information items stored in the slave circuit 2 are reset by a reset signal supplied to the reset terminal R. Or upon receipt of a set signal at the set terminal S, a binary signal of "1" is forcefully stored in the slave circuit 2. Where the terminal RevP is supplied with a pulse of "1", then items of information supplied to the terminals $J_2$, $K_2$ are stored in the master circuit 1. The information items thus stored in the master circuit 1 are shifted to the slave circuit 2 upon receipt of a clock pulse at the terminal CP.

Thirteen units of the memory circuit shown in FIG. 2 are connected together as illustrated in FIG. 1. Each time, therefore, the terminal FwP of FIG. 1 is supplied with a clock pulse, information items of "1" stored in the memory circuit M1 are forward shifted through the following memory circuits M2 to M13 in succession. Conversely, where the terminal RevP is supplied with a pulse, then information items of "1" stored in the memory circuit M13 are backward shifted to the memory circuit M1. In this case, a memory circuit, for example, M3 stored with information items of "1" has its terminal $CH_3$ raised in potential. This elevated potential is connected into a voltage having a value corresponding to the specified number of a television channel being preset by the corresponding voltage divider VD3, and conducted to the variable capacity diode 22 of the tuning circuit 21 through the corresponding diode $D_3$.

The above-mentioned circuit arrangement enables the authorized television broadcasting channels to be automatically selected successively in the increasing or decreasing order of the designated numbers of said channels by supplying a pulse to the terminal FwP or RevP and also any of said channels to be picked up separately at random regardless of the above-mentioned order by depressing the corresponding one of the channel-selecting pushbutton switches $SW_1$ to $SW_{13}$. The second and third stationary contacts 25, 26 of the channel-selecting pushbutton switches $SW_1$ to $SW_{13}$ are always connected by the movable contact 27. On the other hand, the first and third stationary contacts 16, 26 of any of said switches are connected together only while it is operated. Depression of, for example, the channel-selecting pushbutton switch $SW_3$ causes the output terminal $CH_3$ of the memory circuit M3 to be connected to the positive power source +VDD and the slave circuit 2 of the memory circuit M3 to be forcefully brought to a state stored with information of "1". Where, under this condition, any other memory circuit is already stored with information of "1", then two of the input signals to the parity signal generator P are brought to a level of "1", causing an output signal from said generator P to be conducted to the reset terminals R of all the memory circuits M1 to M13. As the result, the memory circuit previously stored with information of "1" is immediately reset. Since, however, depression of the channel-selecting pushbutton switch $SW_3$ by a user continues relatively long, the memory circuit M3 connected to said switch $SW_3$ continues to be stored with information of "1". During this depression, the number of input signals of "1" to the parity signal generator P is reduced to one, causing said generator P to stop the generation of any output signal. Even after release of the channel-selecting pushbutton switch $SW_3$, therefore, the memory circuit M3 remains in a state stored with information of "1". The details of the above-mentioned arrangement of a television channel-selecting device invented by the present inventors are already set forth in the Japanese Patent Application No. 29,384, 1972.

Figure 3:
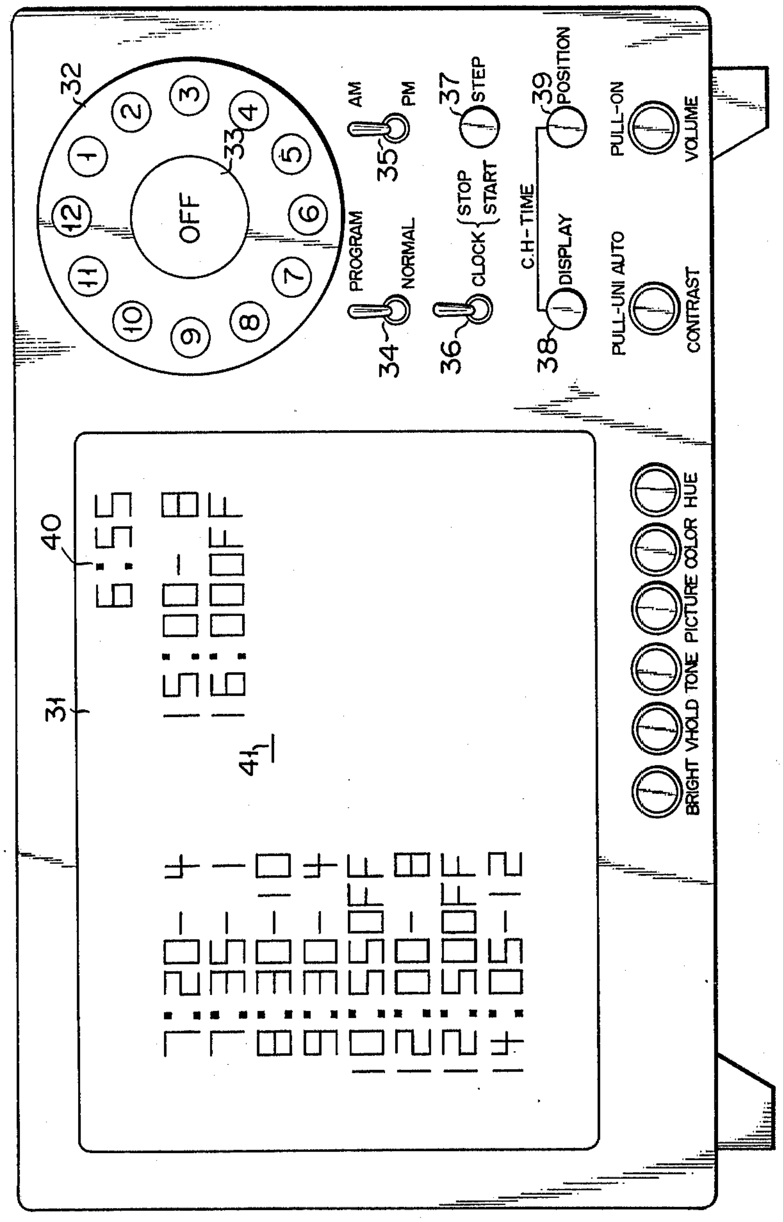
FIG. 3 is a front view of a television receiver provided with the television receiving program-presetting system of this invention.

FIG. 3 is a front view of a television receiver provided with a television receiving program-presetting system according to this invention. A channel-selecting switch panel 32 is provided on the upper right side of the Braun tube. This channel-selecting switch panel 32 has the twelve channel-selecting pushbutton switches $SW_1$ to $SW_{12}$ of FIG. 1 provided in a circular arrangement. The marks ① to ⑫ indicated on the switch panel 32 represent not only the channel-selecting pushbutton switches $SW_1$ to $SW_{12}$ of FIG. 1, namely, the designated numbers of the television channels being preset but also the time at which the user desires to begin to listen in to broadcasting through said channels by the proper operation of said pushbutton switches, the details of said operation being described later. The numerals denoting the channel-selecting pushbutton switches are arranged in the same order as the similar rotations given on a clock dial. Namely, the marks ⑫ and ⑥ are positioned at the top and bottom of the switch panel 32, and the marks ⑨ and ③ on the left and right sides of said panel 32. Thus the numerals denoting the channel-selecting pushbutton switches concurrently represent the divisions of time, namely, hours and 5-minute units shown on a clock dial. A desired television program is preset by operating the pushbutton switches in the later described manner with correlationship kept between the designated number of the television channel through which said desired program is broadcast and the time at which the user wishes to begin to listen in to said program.

A pushbutton switch 33 marked "OFF" and provided at the center of the switch panel 32 corresponds to the switch $SW_{13}$ of FIG. 1, and when depressed in advance, renders the television receiver inoperative at the preset time.

Three changeover switches 34 and 36 are provided below the channel-selecting pushbutton switch panel 32. The first changeover switch 34 is switched over to the "Normal" side when the television receiver is used as an ordinary one and to the "Program" side when information is to be supplied to said receiver for the presetting of a desired program. This first changeover switch 34 is hereinafter referred to as "a program switch". The second changeover switch 35 is thrown to the "AM" side when the time data associated with a desired program being preset (hereinafter referred to as "a program time") lies in the former half of the day and to the "PM" side when said "program time" falls within the latter half of the day. This second changeover switch 35 is hereinafter referred to as an "AM-PM switch". The reason for providing said second switch 35 is that where the aforesaid channel-selecting pushbutton switch panel 32 is used as a clock dial, it is necessary to distinguish between the first and second halves of the day. The third changeover switch 36 is used to adjust the current time (shown in FIG. 3, numeral 40) purposely displayed on the Braun tube of a television receiver to the correct time if said current time is fast or slow. This third changeover switch 36 is hereinafter referred to as "a time-adjusting switch". Three more pushbutton switches 37–39 are provided in addition to the above-mentioned changeover switches 34 to 36. The first pushbutton switch 37 is intended to shift a step bar 41 for indicating the address position on the Braun tube screen 31 at which the succeeding preset program is to be displayed. Each time said first pushbutton switch 37 is depressed, the step bar 41 advances one step on the Braun tube screen 31. This first pushbutton switch 37 is hereinafter referred to as "a step switch". The second pushbutton switch 38 is depressed to show on the Braun tube screen 31 either the current time 40 alone or both the current time and the designated number (not shown in FIG. 3) of any channel through which broadcasting now happens to be carried on. This second pushbutton switch 38 is hereinafter referred to as "a time display switch". The third pushbutton switch 39 is used to change the display position of the current time 40 to any of the four corners of the Braun tube screen 31. This third push-button switch 39 is hereinafter referred to as "a time display position switch". The front panel of an ordinary color television receiver is fitted with various knobs, some of which are neither shown in FIG. 3, nor described herein.

Where, with the television program-presetting system of this invention, the "program switch" 34 is thrown to the program side, and the selected ones of the pushbutton switches ① to ⑫ on the switch panel 32 which represent the "hour", "minute" and "channel number" being preset are depressed in the order mentioned, then the memory built in the program presetting system is stored with items of program information consisting of said "hour", "minute" and "channel number ". These items of information thus stored are immediately displayed on the Braun tube screen 31 as illustrated in FIG. 3.

FIG. 4 is a block circuit diagram of the memory and its control device included in the television program presetting system of this invention. The output terminals $CH_1$ to $CH_{13}$ of the memory circuits M1 to M13 of FIG. 1 are jointly connected to an encoder 51 shown in FIG. 4, and also to the output side of a decoder 52. The encoder 51 detects that of the output terminals $CH_1$ to $CH_{13}$ of the memory circuits at which an information signal of binary code "1" appeared and converts the referential numeral of said detected output channel, namely, the designated number of a preset channel into, for example, 4-bit digital information. The decoder 52 deciphers, as later described, the 4-bit digital information delivered to its input side, and supplies the deciphered result to the specified one of the output terminals $CH_1$ to $CH_{13}$ of the memory circuits M1 to M13 in the form of an information signal of binary code "1".

An output signal from the encoder 51 is conducted to a gate circuit 54 through the corresponding signal bus line 53. An output signal from the gate circuit 54 is delivered to a channel number register 56 through the corresponding signal bus line 55. Said register 56 is temporarily stored with the number of a television channel, and sends an output signal denoting the channel number to a switching gate circuit 59 through bus lines 57, 58. The switching gate circuit 59 selects one from among a plurality of sets of input information items, and delivers a signal denoting the selected set of information items to the output side. An output signal from said switching gate circuit 59 denoting said selected set of information items is transmitted to the decoder 52. The aforesaid gate circuit 54 and switching gate circuit 59 are controlled by a signal supplied from the program switch 34 through the input terminal 60 of the input selector 62. This control signal has a binary level of "1" or "0" according as the program switch 34 is thrown to the "program" or "normal" side. The gate circuit 54 and switching gate circuit 59 have the gates closed while the input terminal 60 of the input selector 62 is supplied with a signal of "1" and opened while said input terminal 60 is supplied with a signal of "0". While the program switch 34 is thrown to the "normal" side, the number of any channel through which broadcasting is carried on is coded by the encoder 51. The signal thus coded passes through the gate circuit 54 to be stored in the channel number register 56. When the program switch 34 is thrown to the "program" side, the gate circuit 54 and switching gate circuit 59 have the gates closed. Accordingly, an output signal from the encoder 51 is delivered to an input selector 62 through the corresponding bus line 61. The input selector 62 is supplied with a control signal from the input terminal 60 of the input selector 62, thereby conducting input information from the bus line 61 to the output bus lines 63, 64, 65 when a signal from the input terminal 60 has a level of "1" (program). When an output signal from the input terminal 60 has a level of "0" (normal), then the input selector 62 stops the generation of any output signal. The input selector 62 is further supplied with a signal from the input terminal 66 for control. This input terminal 66 is supplied with an output signal from the time-adjusting switch 36. This output signal is of the binary type, that is, has a level of "1" or "0" according as the time-adjusting switch 36 is thrown to the "stop" side, or the "start" side. When the time-adjusting switch 36 is thrown to the "stop" side, namely, when an output signal from the terminal 66 has a level of "1", then program information delivered from the bus line 61 to the input selector 62 is not transmitted to the first group of output bus lines 63 to 65, but to the second group of output bus lines 67, 68. Said first group of bus lines 63 to 65 is connected to the memory 69. The output bus line 63 is connected to the memory 69 through an adder 70. A number "12" is added to the information delivered from the bus line 63 in said adder 70. The terminal 71 is supplied with a signal of "0" when the changeover switch 35 is thrown to the "AM" side and with a signal of "1" when said switch 35 is thrown to the "PM" side. Only when the terminal 71 is supplied with a signal of "1", the above-mentioned number "12" is added to the information supplied from the input selector 62 to the bus line 63.

Where the selected ones of the pushbutton switches $SW_1$ to $SW_{13}$ on the panel 32 which denote the "hour", "minute" and "channel number" being preset are depressed in the order mentioned with the program switch 34 thrown to the "program" side, then the items of information representing these preset data are transmitted through the encoder 51, bus line 61, input selector 62, and a group of output bus lines 63 to 65 to be stored in the memory 69. The input selector 62 is provided with a distribution circuit for detecting the items of information delivered from the input bus line 61 and allotting said items of information to the corresponding output bus lines 63, 64, 65 in the order in which they are received. Thus, the output bus line 63 is supplied with information on the "hour", the output bus line 64 with information on the "minute", and the output bus line 65 with information on the "channel number". A set of information items stored in one of the addresses of the memory 69 consists of fourteen bits as illustrated in, for example, FIG. 5. The first bit denotes information on the step bar indicated by the referential numeral 41 in FIG. 3. The 2nd to 6th bits represent information on the "hour", the 7th to 10th bits information on the "minute", and the 11th to 14th bits information on the "channel number". When the terminal 66 receives a signal of "1", namely, when the time-adjusting switch 36 is thrown to the "stop" side, then the input selector 62 supplies a clock device 72 (hereinafter referred to as "a timer") with only the items of information on the "hour" and "minute" included in those delivered from the input bus line 61 through the corresponding bus lines 67, 68. The timer 72 is set upon receipt of the time data transmitted from the input bus line 61. The operation of the input selector 62 is later detailed.

The timer 72 has its input terminal 73 supplied with standard clock pulses obtained from, for example, a 50 Hz A.C. input signal, and generates signals denoting the "hour" and "minute" by dividing the frequency of said clock pulses. Namely, the timer 72 comprises four cascade connected frequency dividers 72-1 to 72-4 which produce the output waves whose frequencies correspond to one part of 3000, one-tenth, one-sixth and one part of 24 of the original input pulse frequency respectively. These frequency dividers 72-1 to 72-4 give forth output signals in units of 1 minute, 10 minutes, 1 hour and 1 day (or 24 hours) respectively. Time information furnished by the timer 72 is transmitted to a time comparator 75 as one of two sets of time information items being compared by said comparator 75. The other set of time information items being compared by said comparator 75 are constituted by time information items previously stored in the memory 69 and now read out therefrom through an output bus line 76. When two sets of time information items coincide as the result of comparison, then the time comparator 75 sends forth, for example, a signal of "1" to the switching gate 59. When the coincidence signal of "1" is delivered to the switching gate 59, the time information read out from the memory 69 is transmitted through the switching gate 59 to the decoder 52 in place of the time information supplied from the output bus line 58.

The input terminal 78 is supplied with pulse signals sent forth from the step switch 37. These pulse signals are counted by an address counter 79, which comprises four cascade connected flip-flop circuits and is connected to the memory 69 by a bus line 80 consisting of four signal lines so as to designate the required address of the memory 69, for example, by a 4-bit digital code. The memory 69 has, for example, 16 addresses, some of which are shown in FIG. 3. Each address is stored with one set of items of receiving program information associated with a television program. The memory 69 normally has its addresses designated by an address counter 79. Where, however, a bus line 82 and an address designating signal-interposing circuit 83 are operated, then said address designation is preferentially carried out by an address register 81. The address designating signal-interposing circuit 83 is connected to a control line 84 extending from the input selector 62. While said control line 84 is supplied with a "1" signal, the address register 81 is prevented from interposing an address-designating signal. The input selector 62 is so arranged that where any of the channel-selecting pushbutton switches on the panel 32 is depressed with the program switch 34 thrown to the "program" side, then said input selector 62 gives forth a write-instructing pulse, which in turn is delivered to the control line 84. Where a given television program is to be preset, it is advised first to depress the step switch 37 so as to designate the address in which information on said program is to be stored, and depress the selected pushbutton switches on the panel 32, repeatedly if necessary, which denote the required items of program information, namely, the "hour" and "minute" at which the user desires to begin to listen in to said television program and the designated number of the channel through which said program is broadcast, in the order of the above-mentioned three items of information. This process enables the items of information of a television program being preset to be written in that address of the memory 69 which is designated by the address counter 79. The presetting of the succeeding television program can be effected by depressing the step switch 37 to advance the addresses of the memory 69 by one unit address, followed by the same operation of the pushbutton switches on the panel 32 as in the preceding case. The same procedure enables the items of information of any other television program to be written in the memory 69.

Where the pushbutton switch 33 marked (OFF) on the panel 32 is depressed immediately after depressing the selected switches of the twelve pushbutton switches (1) to (12) for presetting the "hour" and "minute" at which the user intends to cut off the television receiver in place of presetting a channel number, then the television receiver is rendered in-operative when the preset time arrives.

The memory 69 is so arranged that when a write-instructing signal is supplied to the control line 84, then the address of said memory 69 designated by the address counter 79 is stored with program information as previously described, but in other cases, the program information stored in the address designated by the address register 81 is always read out. When, therefore, the program switch 34 is thrown to the "normal" side, the items of program information stored in the memory 69 are successively read out by the address register 81 to the time comparator 75 to be compared with the time information delivered from the timer 72. Where coincidence is established between both forms of time information, then an item of information on the designated number of the preset television channel included in the items of program information stored in the memory 69 or the information on the "OFF" condition which is stored in the memory 69 upon depression of the pushbutton switch 33 marked (OFF) is transmitted to the decoder 52 to emit a decoded signal. When the decoded signal "1" is given to selected one of the terminals $CH_1$ to $CH_{12}$, the channel corresponding to the selected terminal is selected. When the decoded signal "1" is supplied to the terminal $CH_{13}$, the television receiver is cut off. A coincidence signal given forth from the time comparator 75 is transmitted to an extinction pulse generator 85, which in turn produces an extinction pulse. The period in which said extinction pulse continues to be generated is chosen to start after the program information read out from the memory 69 passes through the switching circuit 59 to the decoder 52 and be brought to an end immediately before the memory 69 is again supplied with the succeeding read out-instructing signal. Said extinction pulse is conducted to the address designating signal-interposing circuit 83 and acts as an instruction for the writing of a signal in the memory 69 like an output signal from the control line 84. In this case, that address of the memory 69 to which said write-instructing signal is to be delivered is specified by the address register 81. The address thus specified is stored with the items of program information supplied from the input bus lines 63 to 65.

While the program switch 34 is thrown to the "normal" side, the input bus lines 63 to 65 of the memory 69 are not supplied with any program information. Consequently, the memory 69 is stored with, for example, the information whose bits are all of the "0" level. As used in this invention, the writing of such "0" information is referred to as the extinction of stored data. The above-mentioned extinction pulse causes the items of program information drawn out from the memory 69 to be extinguished when the preset television program has been fully enjoyed by the user.

According to this invention, different forms of program information are stored in the memory 69 with the above-mentioned channel-selecting device used as input means and the receiver is operated according to the stored program information. These forms of program information may be successively displayed on the Braun tube screen 31 as illustrated in FIG. 3. Said display is effected by display-instructing signals supplied from the later described display device (FIG. 8) to an input terminal 86 (FIG. 4) through an output terminal 136 (FIG. 8). The display-instructing signals are converted into parallel arranged coded signals by a series-parallel converter 87 (FIG. 4) to be stored in the address register 81. The different sets of items of program information stored in the addresses of the memory 69 designated by output signals from the address register 81 are successively read out through the output bus line 76 (FIG. 4) to be conducted to an output selector 88.

The items of output information delivered from the address register 81 and those from the address counter 79 are jointly conducted to an address comparator 89, which in turn sends forth a coincidence output signal, for example, of "1" to the output selector 88 when coincidence takes place between the addresses from the address register 81 and address counter 79. The output information from the address register 81 concurrently acts as central signals for the output selector 88. The output selector 88 monitors the output information from the address register 81. Where said output information from the address register 81 represents the addresses of the memory 69 and upon receipt of the coincidence signals from address comparator 89, then the output selector 88 supplies the various forms of program information read out from the memory 69 to a parallel-series converter 91 through an output bus line 90. This parallel-series converter 91 converts various forms of program information supplied thereto into coded signals arranged in series in terms of time and sends forth said series-arranged coded signals from its output terminal 92 to the input terminal 137 of the later described display device (FIG. 8).

The information delivered to the address register 81 includes not only signals designating the selected addresses of the memory 69 but also signals instructing the display of the current time 40, and channel number which is on receiving state (not shown in FIG. 3). These signals for instructing the display of current time and channel number are given forth from the output terminal 136 of the display device (FIG. 8) through the input terminal 86 (FIG. 4), when the time display switch 38 (FIG. 3) is depressed. The above-mentioned time display-instructing signal orders the time information defined by the timer 72 to be displayed on the Braun tube screen 31. Where supplied with said instruction signal through the address register 81, the output selector 88 delivers the time information received from the bus line 74 to the output bus line 90. The channel display-instructing signal orders the designated number of a television program now on display to be set forth on the Braun tube screen 31. When supplied with said channel display-instructing signal from the address register 81, the output selector 88 delivers to the output bus line 90 the information stored in the channel number register 56 through the bus line 57. The issue of signals instructing the display of the current time and channel number can be established by a single pushbutton switch. For example, the current item display switch 38 may be pushed for the first time to display the channel number, for the second time to display the current item and for the third time to extinguish any display, namely, effecting the display of information each in the proper time sequence. It will be noted, however, that this invention can be so modified, for example, as to change the time sequence in which the items of each information are to be displayed or simultaneously to display both current time and channel number now being on receiving state.

FIG. 6 is a block circuit diagram of the input selector 62 included in FIG. 4. The input terminal 101 of said input selector 62 is connected to the output terminal 28 of the television channel-selecting device of FIG. 1. Said output terminal 28 is supplied with one pulse, each time any of the pushbutton switches $SW_1$ to $SW_{13}$ is depressed. Where all these pushbutton switches $SW_1$ to $SW_{13}$ are opened as shown in FIG. 1, the above-mentioned output terminal 28 is supplied with the potential of the positive power source +VDD. Where any of the pushbutton switches $SW_1$ to $SW_{13}$ is depressed, then said positive power source +VDD is shut off to be brought to a zero potential. Upon release of said depression, said positive power source +VDD is again put into operation. A pulse delivered from the output terminal 28 of the channel selector is transmitted from the input terminal 101 of the input selector 62 to the binary-ternary counter 102 thereof. Upon receipt of a switching signal from the input terminal 60 or 66 of the input selector 62, the counter 102 is operated as a ternary or binary type accordingly. Namely, where the program switch 34 (FIG. 3) is thrown to the "program" side, then the input terminal 60 of the input selector 62 is supplied with a "1" signal and the counter 102 acts as a ternary type to supply a pulse to three output terminals 102-1, 102-2, 102-3 in turn. This sequential supply of a pulse is repeated. Output pulses from the three output terminals 102-1, 102-2, 102-3 of the counter 102 are conducted to three AND gates 103, 104, 105 respectively. These three AND gates 103, 104, 105 are each supplied with a pulse from the input terminal 60 of the input selector 62 and an output pulse from the output bus line 61 of the encoder 51 (FIG. 4) at the same time. Output signals from said three AND gates 103, 104, 105 are sent forth to three output bus lines 63, 64, 65 (FIG. 4) respectively. The first depression of, for example, the pushbutton switch ⑦ on the panel 32 causes the binary-ternary counter 102 to produce an output signal from the first output terminal 102-1 to open the AND gate 103. As the result, the data 7 = (0111) delivered from the encoder 51 which denotes the "hour", namely, "7 o'clock" passes through said AND gate 103 to the output bus line 63. The succeeding depression of the pushbutton switch ④ causes the binary-ternary counter 102 to give forth an output signal from the second output terminal 102-2 to open the AND gate 104. As the result, the data 4 = (0100) supplied from the encoder 51 which denotes the "minute", namely, "20 minutes" is carried to the output bus line 64. The final depression of the same pushbutton switch ④ causes the binary-ternary counter 102 to generate an output signal from the third output terminal 102-3 to open the AND gate 103. As the result, the data 4 = (0100) sent forth from the encoder 51 which denotes the channel number, namely, "4" is conducted to the output bus line 65. The items of information passing through the three output bus lines 63, 64, 65 denote, as mentioned above, the "hour", "minute" and "channel number", though originally representing the numbers of the pushbutton switches thus depressed. Where, therefore, the same pushbutton switch, for example,④is depressed three times, the first depression causes a signal denoting the "hour", namely, "4 o'clock" to be sent forth through the output bus line 63; the second depression causes a signal denoting the "minute", namely, "20 minutes" to be drawn out through the output bus line 64; and the third depression causes a signal denoting the "channel number", namely, "4" to be produced through the output bus line 65. As previously described, the twelve pushbutton switches①to ⑫on the panel 32 are arranged in the same order as the similar rotations on a clock dial. Where, therefore, time data is to be preset, the operation of said pushbutton switches can be easily effected if the long and short needles of the clock are borne in mind. Where the user wishes to begin to listen in to the channel No. 1, for example, at 35 minutes past 7 o'clock, it is advised first to depress the pushbutton switch ⑦ twice and finally depress the pushbutton switch①once, namely, in the order of⑦⑦①. Where it is desired to stop the television receiver at 4 o'clock in the afternoon, then it is advised first to throw the AM/PM changeover switch 35 to the "PM" side and then depress the pushbutton switches marked④, ⑫, (OFF) in the order mentioned. FIG. 5 presents the arrangement of coded signals denoting the items of program information preset in the above-mentioned manner.

Where, in FIG. 6, the input terminal 66 of the input selector 62 is supplied with a "1" signal, namely, where the time adjustment switch 36 is thrown to the "stop" side, then the binary-ternary counter 102 acts as the binary type. The output terminals 102-1, 102-2 alone thereof are repeatedly supplied with pulses. These two output terminals 102-1, 102-2 are connected to two AND gates 106, 107 respectively. An output signal from the input terminal 66 of the input selector 62 and output program information from the encoder 51 (FIG. 4) are supplied in parallel to said AND gates 106, 107 respectively through the line 61. Where, under this condition, any of the pushbutton switches on the panel 32 is depressed twice, then signals denoting the "hour" and "minute" are generated on the output side of the AND gates 106, 107. These items of time information are transmitted to the timer 72 (FIG. 4) through the output bus lines 67, 68 respectively, causing the timer 72 to be set at the time denoted by said items of time information. Where the time adjustment switch 36 is thrown to the "start" side, then the timer 72 begins to count time starting with said set time. The timing pulse generator 108 (FIG. 6) gives forth a pulse to the central line 84 (FIG. 4) a prescribed length of time after supplied with a pulse from the input terminal 101 of the input selector 62, thereby instructing writing in the memory 69. This timing pulse generator 108 counts clock pulses supplied to the input terminal 109 thereof, and gives forth a pulse having a prescribed time width a certain length of time after receiving a pulse from the input terminal 101 of the input selector 62.

FIG. 7 is a detailed block circuit diagram of the output selector 88 of FIG. 4. The input bus line 82 of the output selector 88 supplied with address information from the address register 81 is connected to an address discriminator 111 which in turn determines whether the signal received represents a time display-instructing signal, channel number display-instructing signal or a signal designating any of the addresses of the memory 69. Said address discriminator 111 produces an output "1" signal through any of the three output terminals 111-1, 111-2, 111-3 according to the type of a signal received through the input bus line 82. Each of the sixteen addresses of the memory 69 can be represented by 4-bit codes. If, in this case, one address is denoted by five bits by adding one more bit, and it is prearranged that the address whose most significant digit is "0" represents that of the memory 69 and the address whose most significant digit is "1" denotes a time or channel number display-instructing signal, then the address discriminator 111 can be formed of a simple address comparator. This address discriminator 111 produces an output signal from its first output terminal 111-1 when supplied with a time display-instructing signal. As the result, an AND gate 112 is opened to deliver time information supplied from the bus line 74 to the output bus line 90 through an OR gate 113. When receiving a channel number display-instructing signal, the address discriminator 111 generates an output signal through the second output terminal 111-2. As the result, an AND gate 114 is opened to transmit a signal from the bus line 57, namely, the data stored in the channel number register 56 (FIG. 4) to the output bus line 90 through the OR gate 113. When receiving a signal designating any of the addresses of the memory 69, the address discriminator 111 gives forth a "1" signal through the third output terminal 111-3. As the result, the AND gate 115 is opened to deliver to the output bus line 90 a signal from the bus line 76, namely, program information stored in the memory 69 and also a coincidence signal of "1" supplied from the address comparator 89 (FIG. 4) which is mixed with an output signal from the AND gate 115 in an OR gate 116.

FIG. 8 is a block circuit diagram of a display device for presenting the program information stored in the memory 69 on the Braun tube screen 31. While the program switch 34 (FIG. 3) is thrown to the "program" side, the input terminal 121 of the display device is supplied with a "1" signal, which controls a gate circuit 122, shuts off a video signal from a video signal generator 123 and instead causes the Braun tube to be supplied with an output signal from a character signal generator 124. The input terminal 125 of a display position selection circuit 140 and the input terminal 126 of a time-channel selection circuit 141 are supplied with a pulse signal from the time display position switch 39 and time display switch 38 respectively. Further, the input terminals 127, 128 of a vertical address position-designating circuit 129 on the Braun tube screen 31 are supplied with the horizontal and vertical synchronizing pulses of the television receiver respectively. Said vertical address position-designating circuit 129 counts horizontal synchronizing pulses delivered from the input terminal 127 during one field period. The vertical position of an address on the Braun tube screen 31 is designated according to the number of said horizontal synchronizing pulses thus counted. The horizontal synchronizing pulses are conducted not only to the input terminal 127 of the vertical address position-designating circuit 129 but also to a clock pulse generator 130, for example 4 MHz clock pulse generator, so as to establish coincidence between the phase in which the oscillation of said generator 130 is commenced and the phase of the horizontal synchronizing pulses. The clock pulse generator 130 consists of, for example, a gated oscillator type which stops the generation of clock pulses while horizontal synchronizing pulses are supplied, and continues said generation during the absence of said horizontal synchronizing pulses. An output signal from the clock pulse generator 130 is transmitted to a horizontal address position-designating circuit 131, which also counts the number of clock pulses issued from the clock pulse generator 130 during one horizontal scanning period. Output signals from these vertical and horizontal address position-designating circuits 129, 131 are sent forth to an address encoder 132 which successively generates signals designating the addresses of the memory 69.

Where the memory 69 has 16 addresses and the contents or program information stored in the addresses are displayed on the Braun tube screen 31 in the manner in which eight of the program information are displayed in parallel in the form of eight rows on the left side region of the screen defined by the central line taken as the border and remaining eight of the program information are displayed in parallel in the form of eight rows on the right side region with respect to the central line, then the Braun tube screen is defined into 16 display regions corresponding to said rows, and each region on which display is made is arranged to correspond to each of the sixteen addresses of the memory 69. In this case, each display region on the Braun tube screen 31 is chosen to have a vertical length equal to 16 scanning lines and a horizontal length shorter than half that of the Braun tube screen 31. The respective display regions on said screen 31 are designated by the vertical and horizontal address position-designating circuits 129, 131 when they count the number of input pulses supplied thereto. By synthesizing output signals from both address position-designating circuits 129, 131 in the address encoder 132 into the addresses corresponding to the 16 display regions on the Braun tube screen 31, the 16 addresses of the memory 69 can be produced sequentially during one field period of television scanning. Since the 16 addresses are each denoted by 4-bit codes, the generation of each said address is effected by a combination of a 1-bit signal delivered from the horizontal address position-designating circuit 131 which specifies a display position on the Braun tube screen 31 on the right or left side of the central line thereof and three bit signals obtained from the vertical address position-designating circuit 129 which defines the vertical address positions. The vertical address position-designating circuit 129 consists of, for example, a counter 151 formed of nine flip-flop circuits shown in FIG. 10. Output signals $A_0$, $A_1$, $A_2$ from the 5th to 7th flip-flop circuits are drawn out, from a 16-scale counter 151, which is reset by a vertical synchronizing pulse supplied from the input terminal 128.

The horizontal position-designating circuit 131 consists of a counter 152 for counting the number of 4 MHz clock pulses produced by the clock pulse generator 130 and a flip-flop circuit 153 which is set by an output signal from said counter 152 and reset by a horizontal synchronizing pulse transmitted from the input terminal 127. The counter 152 is similarly reset by a horizontal synchronizing pulse conducted from said input terminal 127 and, when counting about one hundred 4 MHz clock pulses, detects a substantially halfway point in the horizontal direction of the Braun tube screen 31 and sets the flip-flop circuit 153 at that time. As the result, the flip-flop circuit 153 generates a signal $A_3$ (FIG. 10) of, for example, "0" during the former half of a scanning period along one line and "1" during the latter half of said period, namely, a signal having a stepped waveform as a whole. Output signals $A_0$ to $A_3$ from the vertical and horizontal address position-designating circuits 129, 131 are supplied to one input terminal each of the four AND gates 154 to 157 constituting an address encoder 132. The other input terminals of said AND gates 154 to 157 are supplied with a timing signal to produce the aforesaid signals $A_0$ to $A_3$ in a proper time sequence, thereby forming an address of 4 bits.

The vertical and horizontal address position-designating circuits 129, 131 may be formed of a shift register in place of a counter. In this case, the address encoder 132 may consist of the type which forms an address by drawing out bit signals from some of the output positions of said shift register. The output information delivered from the address encoder 132 is converted into series-arranged codes by a parallel-series conversion circuit 135 (FIG. 8). The coded signals thus arranged are sent forth to the input terminal 86 (FIG. 4) through the output terminal 136 (FIG. 8).

Series arranged coded signals denoting items of program information transmitted from the output terminal 92 (FIG. 4) are stored in a series-parallel conversion register 138 through an input terminal 137 (FIG. 8). This register 138 has a capacity of storing a sufficient amount of items of program information stored in two addresses of the memory 69 and denoting the "hour", "minute" and "channel number". Namely, said register 138 is temporarily stored with address information supplied from the output terminal 136 (FIG. 8), that portion of program information stored in the memory 69 which is designated by a signal supplied from the time display switch 38 and the information delivered from the timer 72 (FIG. 4) or the channel number register 56 (FIG. 4). The information stored in the series-parallel conversion register 138 is read out upon receipt of a readout-instructing pulse from a readout control circuit 139 in the form divided into the "hour", "minute" and "channel number". The vertical and horizontal address position-designating circuits 129, 131 supply the readout control circuit 139 with a pulse denoting a display position on the Braun tube screen 31. Said readout control circuit 139 is further supplied with a signal from a display position selection circuit 140 formed of a counter for counting the number of pulses supplied through its input terminal 125 and also with an output signal from a time-channel selection circuit 141 consisting of a counter for counting the number of pulses conducted through its input terminal 126. The readout control circuit 139 generates a pulse instructing the readout from the series-parallel conversion register 138 upon receipt of the above-mentioned input signals. Program information thus read out from the series-parallel conversion register 138 is transmitted to a binary-coded decimal conversion circuit 142, which selects a decimal number corresponding to a one digit-numeral or one character and delivers said selected decimal number to a display segment selection circuit 143.

This display segment selection circuit 143 selects those of the eight display segments designated by the letters A to H of FIG. 9 which are required to denote a numeral or character specified by output signals from the binary-coded decimal conversion circuit 142. Information represented by the display segments selected by said display segment selection circuit 143 is delivered to the character signal generator 124, which is supplied with not only said information represented by the display segments but also output signals from the vertical address position-designating circuit 129 and the horizontal address position-designating circuit 131, thereby producing a character pattern signal from these input signals. This character pattern signal is delivered to the Braun tube through the gate circuit 122. An output signal from the clock pulse generator 130 is transmitted to a frequency divider 144 which delivers an output pulse whose frequency is one-eighth of the input frequency. Namely, said frequency divider 144 converts an output signal from the clock pulse generator 130 into a 500 kHz clock pulse, which is conducted through the output terminal 145 (FIG. 8) not only to the input terminal 109 (FIG. 6) but also to all the necessary parts of the television program presetting system of this invention.

FIG. 9 indicates the display segments A to H and the lines along which scanning is carried out on the Braun tube screen 31. Each scanning line is represented by an area defined between every two adjacent dotted lines. As apparent from FIG. 9, 16 scanning lines are allotted to each character being displayed. Fourteen of said scanning lines display the character and the remaining two provide a space between every two adjacent vertically arranged characters (FIG. 3). Accordingly, the Braun tube screen 31 has its vertical length divided into plural sets of 16 scanning line regions allotted to each character and its horizontal length into two equal half regions. One set of the sixteen scanning line regions jointly correspond to one address of the memory 69.

Instruction signals and signals denoting one set of items of program information are transmitted from the memory 69 including its control device (FIG. 4) to the display device (FIG. 8) while scanning is carried on along the aforesaid two lines defining a space between every two adjacent vertically arranged characters. While scanning is continued along the first of said two scanning lines, transmission is made of an address-designating signal and one set of items of program information corresponding to the left half portion of the Braun tube screen 31. While scanning is continued along the second of said two scanning lines, transmission is carried out of an address designating signal and another set of items of program information corresponding to the right half portion of the Braun tube screen 31. Two sets of items of program information delivered from two addresses of the memory 69 to the display device (FIG. 8) while scanning is made along the aforesaid two lines are temporarily stored in the series-parallel conversion register 138 (FIG. 8) and thereafter displayed on the Braun tube screen 31, each time scanning is carried out along all the aforementioned 14 lines allotted to each character. Upon completion of scanning along the fourteen lines in both left and right half portions of the Braun tube screen 31, scanning is again commenced along the succeeding two lines defining a vertical character space in both left and right half portions of the Braun tube screen 31, causing two address-designating signals and signals denoting two sets of items of program information to be repeatedly transmitted from the memory 69 to the display device (FIG. 8) in the aforesaid manner.

Transmission of instruction signals and program information during the scanning along the above-mentioned vertical character space-defining two lines is effective to decrease the number of pins required to connect the parts of the display device (FIG. 8) and device including the memory 69 and its control (FIG. 4), where both parts are formed of separate integrated circuits. Where, however, the part including the memory 69 and its control and display device are integrated on a single chip, it is unnecessary to provide means for carrying out scanning along the aforesaid space-defining two lines. In this case, all program information is transmitted through parallel circuits provided in the same number as the required bits, eliminating the necessity of providing a series-parallel conversion circuit and enabling program information read out from the memory 69 to be immediately delivered to the display device (FIG. 8).

The display device (FIG. 8) enables input program information to be displayed the moment it is supplied. Accordingly, the input program information can be examined when it is supplied. Therefore, wrong input program information can be easily extinguished. This process is effected by providing an additional extinction switch; generating a write-instructing pulse through said switch; designating the address stored with said wrong program information by operation of the step switch 37; and extinguishing said information by writing a "0" signal in said address. Further, it is possible to extinguish display alone without wiping out any program information stored in the memory 69, for example, by issuing an instruction pulse through said extinction switch to stop the readout from the series-parallel conversion register 138 of the display device.

As mentioned above, the television program-presetting system of this invention enables input program information to be displaced on the Braun tube screen 31 of the television receiver, the moment said information is introduced at a given point of time, preventing the presetting of a wrong piece of program information. Further, all the circuits used in this invention can be integrated on a single chip, facilitating the incorporation of the subject program-presetting system in any television receiver.

What we claim is:

1. A television receiver program-presetting system for displaying items of program information on the face of a television receiver Braun tube, said system comprising:

a. means for supplying items of program information;
b. memory means for storing each of said items of program information in a designated address;
c. means for designating the instantaneous vertical position on said Braun tube being scanned by said television receiver;
d. address encoder means for generating a plurality of unique display region signals in response to said vertical position, each of said display region signals representing one area on the face of said Braun tube;
e. means for removing an item of program information from an address of said memory means corresponding to one of said display region signals;
f. means for producing signals denoting character patterns corresponding to said removed item of program information; and
g. means for delivering said character patterns to said area of said Braun tube represented by said one display region signal.

2. A television receiver program-presetting system as claimed in claim 1 including means for temporarily shutting off the supply of an image signal from said television receiver to said Braun tube while an item of program information is displayed on said Braun tube.

3. A television receiver program-presetting system as claimed in claim 1 including:

a. means for designating the instantaneous horizontal position on said Braun tube being scanned by said television receiver; and wherein b. said address encoder means generates a plurality of unique display region signals in response to both said vertical and horizontal positions, each of said display region signals representing one area on the face of said Braun tube.

4. A television receiver for program-presetting system as claimed in claim 3 wherein:

a. said means for designating the vertical position includes means for counting the number of horizontal synchronizing pulses of said television receiver; means for resetting said counting means upon receipt of a vertical synchronizing pulse from said television receiver; said means for counting further having at least seven binary counter units with output signals from designated ones of said counter units providing an input to said address encoder means; and b. said means for designating the horizontal position includes means for supplying clock pulses having a higher frequency than the frequency of said horizontal synchronizing pulses; a counter for counting said clock pulses, said counter being reset upon receipt of a horizontal synchronizing pulse and said counter providing a set signal upon receipt of a prescribed number of said clock pulses; said means for designating the horizontal position further includes a binary flip-flop which provides to said address encoder means a first signal upon receipt of a horizontal synchronizing pulse and a second signal upon receipt of said set signal from said counter.

5. A television receiver program-presetting system as claimed in claim 4 wherein:

a. said means for counting the number of horizontal synchronizing pulses comprises nine flip-flop circuit units, said means for counting producing three binary output signals to said address encoder means from said nine flip-flop circuits;

b. said prescribed number of said clock pulses being selected to cause said counter to generate said set signal during the second half of a scanning period along one horizontal line of said Braun tube; and c. said address encoder means synthesizes said three binary output signals from said means for counting and said first and second signals from said binary flip-flop to generate 16 unique display region signals designating eight areas in the left-hand region of the Braun tube and further designating eight areas in the right-hand region of said Braun tube.

* * * * *